United States Patent
Lin

(10) Patent No.: US 9,846,217 B2
(45) Date of Patent: Dec. 19, 2017

(54) THROUGH-PLANE NAVIGATOR

(71) Applicant: KONINKLIJKE PHILIPS N.V., Eindhoven (NL)

(72) Inventor: Wei Lin, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 594 days.

(21) Appl. No.: 14/386,098

(22) PCT Filed: Mar. 21, 2013

(86) PCT No.: PCT/IB2013/052250
§ 371 (c)(1),
(2) Date: Sep. 18, 2014

(87) PCT Pub. No.: WO2013/144791
PCT Pub. Date: Oct. 3, 2013

(65) Prior Publication Data
US 2015/0042332 A1    Feb. 12, 2015

Related U.S. Application Data

(60) Provisional application No. 61/615,508, filed on Mar. 26, 2012.

(51) Int. Cl.
*G01R 33/567* (2006.01)
*G01R 33/34* (2006.01)
(Continued)

(52) U.S. Cl.
CPC ......... *G01R 33/5673* (2013.01); *A61B 5/055* (2013.01); *G01R 33/34* (2013.01);
(Continued)

(58) Field of Classification Search
CPC .. G01R 33/5673; G01R 33/34; G01R 33/385; G01R 33/543; G01R 33/5608; G01R 33/56509; G01R 33/4835; G01R 33/5619
See application file for complete search history.

(56) References Cited

U.S. PATENT DOCUMENTS 5,502,385 A    3/1996   Kuhn et al.
5,636,636 A    6/1997   Kuhn et al.
(Continued)

FOREIGN PATENT DOCUMENTS

RU       2103916 C1    2/1998

OTHER PUBLICATIONS

Bernstein, M.A. et al "Handbook of MRI Pulse Sequence", 2004, Elsevier Academic Press, USA, pp. 406-415.
(Continued)

*Primary Examiner* — Rodney Bonnette

(57) ABSTRACT

A magnetic resonance scanner (10) includes a main magnet (12), gradient coils (14) and a gradient coil controller (28), one or more RF coils (16,50), an RF transmitter (30), an RF receiver (34), and one or more processors (38). The main magnet (12) generates a $B_0$ field. The gradient coils (14) and a gradient coil controller (28) generate gradients across the Bo field. The one or more RF coils (16,50) transmit $B_1$ pulses and receive magnetic resonance signals. The RF transmitter (30) transmits $B_1$ pulses to the RF coils to excite and manipulate resonance. The RF receiver (34) demodulates received resonance signals into data lines. The one or more processors (38) are connected to the gradient coil controller (28), the RF transmitter (30), and the RF receiver (34) and are programmed to control (70) the RF transmitter and the gradient coil controller to implement an interleaved multi-slice 2D imaging sequence which in each of a plurality of TRs generates a first and second navigation data lines and at least one image data line for each of a plurality of slices.
(Continued)

The one or more processors are further programmed to reconstruct (74) the first navigation data lines from the plurality of slices into a first navigation projection image, reconstruct (74) the second navigation data lines from the plurality of slices into a second navigation image; and compare (76) successive navigation projection images to detect and adjust (78) for 3D motion.

24 Claims, 5 Drawing Sheets

(51) Int. Cl.

| | | |
|---|---|---|
| *G01R 33/385* | (2006.01) | |
| *G01R 33/54* | (2006.01) | |
| *G01R 33/56* | (2006.01) | |
| *G01R 33/565* | (2006.01) | |
| *A61B 5/055* | (2006.01) | |
| *G01R 33/483* | (2006.01) | |
| *G01R 33/561* | (2006.01) | |

(52) U.S. Cl.
CPC ......... *G01R 33/385* (2013.01); *G01R 33/543* (2013.01); *G01R 33/5608* (2013.01); *G01R 33/56509* (2013.01); *G01R 33/4835* (2013.01); *G01R 33/5619* (2013.01)

(56) References Cited

U.S. PATENT DOCUMENTS

| | | | |
|---|---|---|---|
| 5,977,769 A | 11/1999 | Bornert et al. | |
| 6,326,786 B1 | 12/2001 | Pruessmann et al. | |
| 2002/0177770 A1* | 11/2002 | Lang | A61B 5/055 600/410 |
| 2006/0244445 A1 | 11/2006 | Sussman | |
| 2007/0015995 A1* | 1/2007 | Lang | A61B 5/055 600/407 |
| 2007/0280508 A1* | 12/2007 | Ernst | A61B 5/055 382/107 |
| 2009/0259120 A1* | 10/2009 | Iwadate | A61B 5/055 600/410 |
| 2011/0116683 A1 | 5/2011 | Kramer et al. | |
| 2012/0002858 A1 | 1/2012 | Huang | |
| 2015/0091563 A1* | 4/2015 | Lu | A61B 5/055 324/309 |
| 2016/0313433 A1* | 10/2016 | Beck | G01R 33/56509 |

OTHER PUBLICATIONS

Nehrke, K. et al "Prospective Correction of Affine Motion for Arbitrary MR Sequences on Clinical Scanners", Magnetic Resonance in Medicine, vol. 54, No. 5, Nov. 2005, pp. 1130-1138.

Lin, Wei et al "Motion Correction using an Enhanced Floating Navigator and GRAPPA Operations", Magnetic Resonance in Medicine, vol. 63, Nov. 2009 pp. 339-348.

Zaitsev, M. et al "Magnetic Resonance Imaging of Freely Moving Objects: Prospective Real-Time Motion Correction using an External Optical Motion Tracking System", Neuroimage, vol. 31. 2006, pp. 1038-1050.

White, Nathan et al "PROMO: Real-Time Prospective Motion Correction in MRI using Image-Based Tracking", Magnetic Resonance in Medicine, vol. 63, 2010, pp. 91-105.

Pipe, James G. "Motion Correction with Propeller MRI: Application to Head Motion and Free-Breathing Cardiac Imaging", Magnetic Resonance in Medicine, vol. 4, 1999, pp. 963-969.

OOI, Melvyn B. et al "Prospective Real-Time Correction for Arbitrary Head Motion using Active Markers", Magnetic Resonance in Medicine, vol 62, 2009, pp. 943-954.

Kadah, Yasser M. et al "Floating Navigator Eche (FNAV) for In-Plane 2D Translational Motion Estimation", Magnetic Resonance in Medicine, vol. 51, 2004, pp. 403-407.

Mendes, Jason et al "Rigid-Body Motion Correction with Self-Navigation MRI", Magnetic Resonance in Medicine vol. 61, 2009, pp. 739-747.

Tamhane, Ashish A. et al "Motion Correction in Periodically-Rotated Overlapping Parallel Lines with Enhanced Reconstruction (Propeller) and Turboprop MRI", Magnetic Resonance in Medicine, vol. 62, 2009, pp. 174-182.

* cited by examiner

THROUGH-PLANE NAVIGATOR

CROSS-REFERENCE TO PRIOR APPLICATIONS

This application is the U.S. National Phase application under 35 U.S.C. §371 of International Application No. PCT/IB2013/052250, filed on Mar. 21, 2013, which claims the benefit of U.S. Provisional Patent Application No. 61/615,508, filed on Mar. 26, 2012. These applications are hereby incorporated by reference herein.

TECHNICAL FIELD

The present application relates generally to Magnetic Resonance ("MR") medical imaging. It finds particular application in conjunction with motion detection and correction in MR imaging, and will be described with particular reference thereto. However, it will be understood that it also finds application in other usage scenarios and is not necessarily limited to the aforementioned application.

BACKGROUND

In head imaging, subject rigid body motion occurs in 3-dimensions ("3D") with both in-plane motion and through-plane motion relative to the slice/slab excited for a MRI scan. For example, in a 2D multi-slice axial or transverse scan, subjects will answer questions affirmatively with a nod which is primarily a through-plane rotation around the left-right axis. A shaking of the head from side to side as a gesture for a negative answer to a question is a rotational motion mainly within the axial imaging plane, but also includes some through-plane aspects. Correction for through-plane motion can occur retrospectively or prospectively. Retrospective techniques such as PROPELLER (periodically rotated overlapping parallel lines with enhanced reconstruction) do not correct for through-plane motion in 2-dimensional ("2D") multi-slice imaging due to the inconsistent imaging volume. One category of prospective techniques employs additional hardware, which requires setup and calibration that prolong the overall scan time. A second category of prospective techniques employ a navigator module with an additional radio frequency (RF) excitation, which is susceptible to interference from the RF excitation of the imaging sequence.

SUMMARY

The present application discloses a new and improved through-plane navigator which addresses the above referenced matters, and others.

In accordance with one aspect, a magnetic resonance scanner includes a main magnet, gradient coils and a gradient coil controller, one or more RF coils, an RF transmitter, an RF receiver, and one or more processors. The main magnet generates a $B_0$ field. The gradient coils and a gradient coil controller generate gradients across the $B_0$ field. The one or more RF coils transmit $B_1$ pulses and receive magnetic resonance signals. The RF transmitter transmits $B_1$ pulses to the RF coils to excite and manipulate resonance. The RF receiver demodulates received resonance signals into data lines. The one or more processors are connected to the gradient coil controller, the RF transmitter, and the RF receiver and are programmed to control the RF transmitter and the gradient coil controller to implement an interleaved multi-slice 2D imaging sequence which in each of a plurality of TRs generates a first and second navigation data lines and at least one image data line for each of a plurality of slices. The one or more processors are further programmed to reconstruct the first navigation data lines from the plurality of slices into a first navigation projection image, reconstruct the second navigation data lines from the plurality of slices into a second navigation image; and compare successive navigation projection images to detect and adjust for 3D motion.

In accordance with another aspect, a method of magnetic resonance imaging includes implementing an interleaved multi-slice 2D imaging sequence in which each of a plurality of repetitions (TR) generates a first and a second navigation data lines and at least one imaging data lines for each of a plurality of slices. After each TR, the first data lines from the plurality of slices are reconstructed into a first navigation projection image. After each TR, the first data lines from the plurality of slices are reconstructed into a second navigation projection image. Successive navigation projection images are compared to detect and adjust for 3D motion.

In accordance with another aspect, a magnetic resonance scanner includes one or more processors which acquire data from each echo train in an interleaved 2D multi-slice imaging sequence in each of a plurality of repetitions TR, the imaging sequence generates navigation data lines orthogonal to each other and imaging data lines that are parallel to each other in each of a plurality of slices. The navigation data lines from the plurality of slices are reconstructed into orthogonal navigation images after each repetition TR. Successive reconstructed navigation images are compared from each repeat time to detect motion. The imaging data lines and/or the interleaved 2D multi-slice imaging sequence is reoriented based on the detected motion in compared navigation images.

One advantage is resides in a fast technique for dynamic motion detection and correction.

Another advantage includes continuing data acquisition for imaging slices when motion occurs.

Another advantage resides in no additional hardware.

Another advantage resides in optional self navigation.

Another advantage includes rigid body motion detection and correction.

Still further advantages of the present application will be appreciated to those of ordinary skill in the art upon reading and understanding the following detailed description.

BRIEF DESCRIPTION OF THE DRAWINGS

The invention may take form in various components and arrangements of components, and in various steps and arrangement of steps. The drawings are only for purposes of illustrating the preferred embodiments and are not to be construed as limiting the invention.

DETAILED DESCRIPTION

Figure 1:
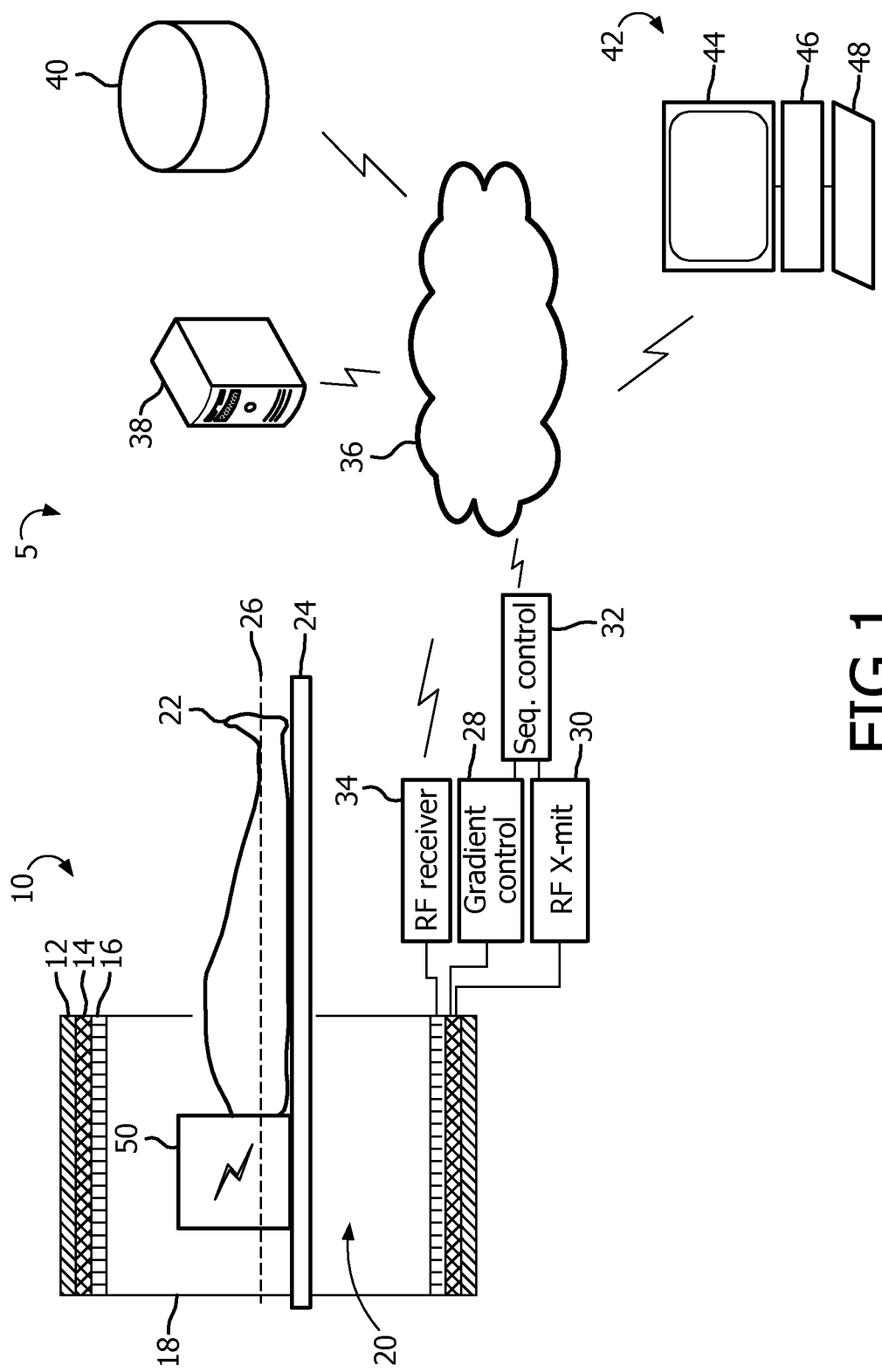
FIG. 1 schematically illustrates an embodiment of a MR imaging system.

With reference to FIG. 1, an embodiment of a MR imaging system 5 is schematically illustrated. A cross section of a MR scanner 10 shows main magnet coils 12, gradient windings 14, and radio frequency ("RF") coils 16. The coils and/or windings are housed in a torodial shaped housing 18 with an open central bore 20. A subject 22 passes through the open central bore 20 supported on a subject support 24 which moves on a continuous or stepped basis. The subject moves parallel to an axis 26 which is centric to the open central bore 20 of the MR scanner 10. The scanning region is located within the open central bore 20 e.g. in a region adjacent the isocenter. The main magnet coils 12 generate a main or $B_0$ magnetic field. The gradient windings 14 and/or RF coils 16 generate $B_1$ fields or RF excitation pulses in any of a variety of configurations during the transmit phase. The gradient windings 14 are controlled by a gradient controller 28 to create magnetic field gradients across the $B_0$ field. The RF coils 16 are controlled by a RF transmitter 30. Both the gradient controller 28 and the RF transmitter 30 are coordinated by a sequence controller 32. The sequence controller 32 controls the timing of the transmit or generation of the magnetic fields to implement a selected imaging sequence. An RF receiver 34 demodulates the resonance signals picked up by the RF coils 16 or a local coil to generate image data. The sequence controller or processor 32 and the RF receiver 34 are connected to a network 36. The network can be a direct connection, an indirect connection, a wired configuration, a wireless configuration, local, remote, a private network, the Internet, or some combination.

The sequence controller 32 alone or in combination with one or more processors 38 configured in one or more servers are programmed to operate the scanner 10 to perform the selected imaging protocol. The one or more processors 38 receive and process the acquired imaging data from the RF receiver. The one or more processors 38 include local memory and/or connection to a storage memory 40. The acquired data is reconstructed by the one or more processors 38 into images, such as a series of parallel 2D image slices, a 3D volume image, or the like. Imaging software controls the one or more processors 38 and includes non-transient computer instructions which can be stored on the storage memory 40 such as a patient records database, a local disk, network attached storage and the like.

An imaging workstation 42 is connected to the network 36. The imaging workstation 42 includes a display device 44, one or more processors 46, and one or more input devices 48. The display device 44 displays images such as the 2D image slices. The display device 44 can also display menus, input screens, panels, imaging sequence lists, and the like for healthcare practitioner selection of the imaging protocol. The healthcare practitioner uses the one of the input devices 48 such as a keyboard, mouse, microphone, and the like to input information such as subject information, scanning protocol, image manipulation instructions and the like. The one or more processors 46 can be inclusive or separate of the one or more processors 38 which control the imaging sequence and receive imaging data. The imaging workstation 42 can be a desktop computer, laptop, tablet, mobile device and the like. The images, patient data, and other data are stored in the patients record in the storage memory 40, such as a hospital records database.

Optionally, one or more local RF coils 50 are used. The local RF coils 50 can be wired or wireless. The local coil includes a shape and configuration suitable for imaging a local region of the subject. For example, local coils include head coils, spine coils, TMJ coils, and the like. The local coil can generate $B_1$ fields or can be receive only coils. In a receive only embodiment, the RF coils 16 generate the resonance excitation and manipulation pulses and the local coils picks up the resonance signals that are demodulated by the RF receiver 34 to produce the image data. The imaging data is transmitted to the one or more processors 38 for image reconstruction.

Although illustrated as a bore-type magnet scanner. C-shaped magnet scanners, open scanners, and the like are also contemplated.

Figure 2:
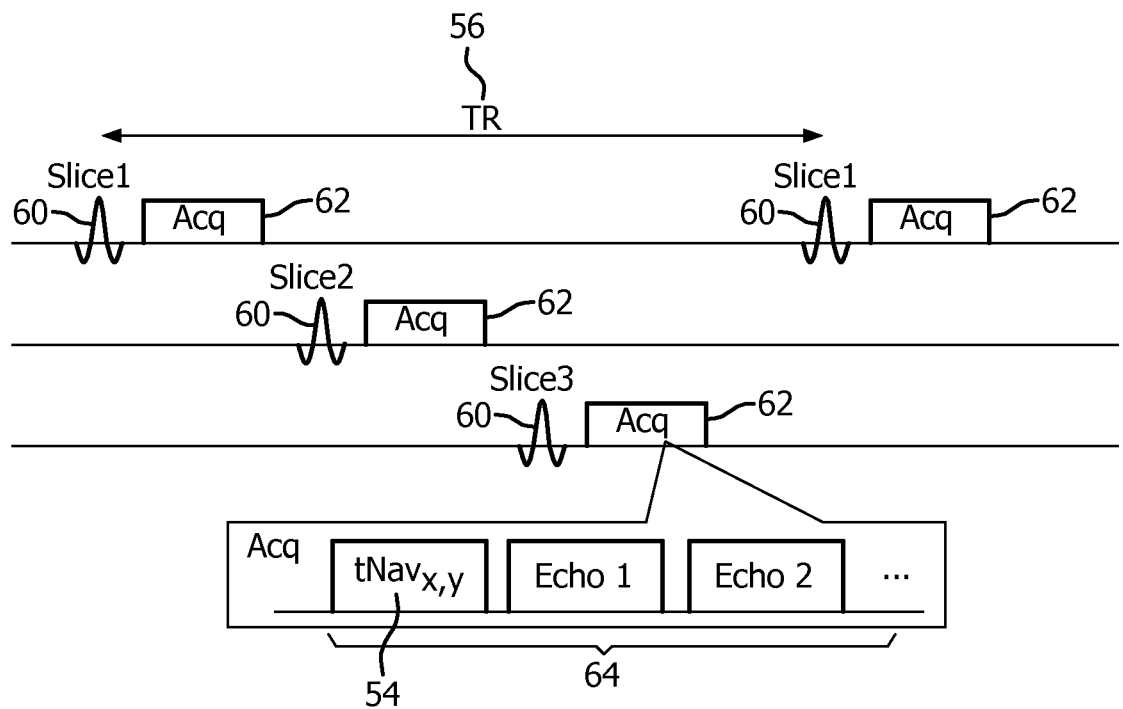
FIG. 2 diagrammatically illustrates one embodiment of a MR interleaved imaging sequence with a navigation echo.

FIG. 2 shows a MR interleaved imaging sequence 52 with a navigation echo 54 of one embodiment. The image data is acquired for a plurality of image slices 58 (FIG. 3) e.g. in an x,y plane, during one repeat time 56 (TR) of the MR interleaved imaging sequence 52. An excitation pulse 60 excites resonance which is encoded with RF and gradient pulses according to the selected imaging sequence to generate resonance signals which are read out in an acquisition phase 62 for each image slice 58. In real-time MR imaging, a repeat time 56 (TR) is typically about 20-30 milliseconds. In the example, a $tNav_{x,y}$ echo or navigation echo 54, an Echo 1, and an Echo 2 are included in a echo train 64 of the acquisition phase 62. That is, the sequence controller controls the gradient coil controller and the RF transmitter to induce two navigation echos which are read out by the receiver as a $k_x=0$ and a $k_y=0$ data line of a navigation k-space. Other lines of navigation k-space are also contemplated. After (or before) the navigation echos are induced and read out, a plurality of echos with each of a plurality of phase encodings are induced and read out and stored in a k-space memory for the corresponding slice. Typically, only a portion of the k-space data lines of each slice are read out in each TR. Several TRs may be needed to fill k-space for each slice. At the end of each TR, the $k_x$-=data lines from all of the slices are reconstructed, such as by an inverse 2D Fourier transform to generate a first navigation projection image 66 in a plane traverse to the plane of the image slices 58. The $k_y=0$ data lines from all of the slices are reconstructed into a second navigation image 68 which is orthogonal to both the slice images 58 and the first navigation projection image 66. By comparing the navigation images in one TR with the navigation images from the preceding TR, motion between the two TRs is readily determined in 3 dimensions. The order and composition of the echo train 64 is determined by the imaging protocol. The first navigation projection image 66 is a projection image projected in the y-direction and the second navigation projection image 68 is a projection image projected in the x-direction.

Figure 3:
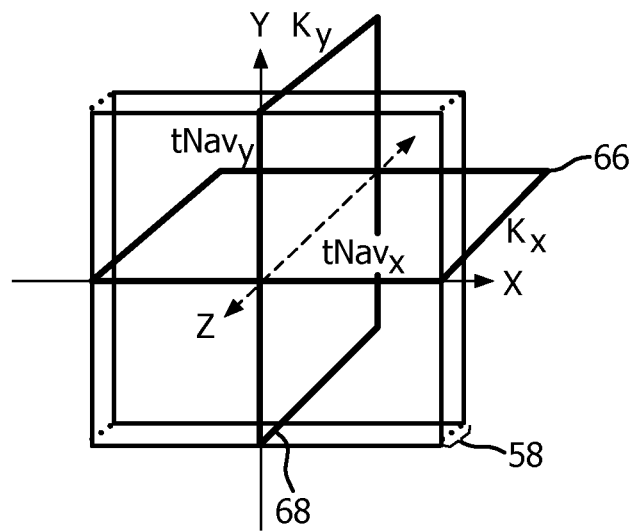
FIG. 3 diagrammatically illustrates the spatial relationships between the navigator planes and the imaging plane.

In FIG. 3, the spatial relationships are illustrated. The 2D image slices 58 are defined in a series of parallel planes. The first and second navigation projection images 66 and 68 are orthogonal to the image plane and to each other. The first and second navigation projection images 66, 68 are shown in k-space with the first navigation projection image 66 oriented in the z-y plane, and the second navigation projection image 68 oriented in the z-x plane. The image slices 58 lie in parallel x-y planes. The z-axis can be parallel to the axis 26 of the subject to generate axial slices or different.

In an alternative embodiment, the navigation echo 54 is embedded in the imaging data. The imaging data is acquired such as a radial acquisition wherein the excitations are performed orthogonal and the reconstructed images data act as the first and second navigation projection images 66, 68, which in this embodiment are low resolution, for self-navigation.

Figure 4:
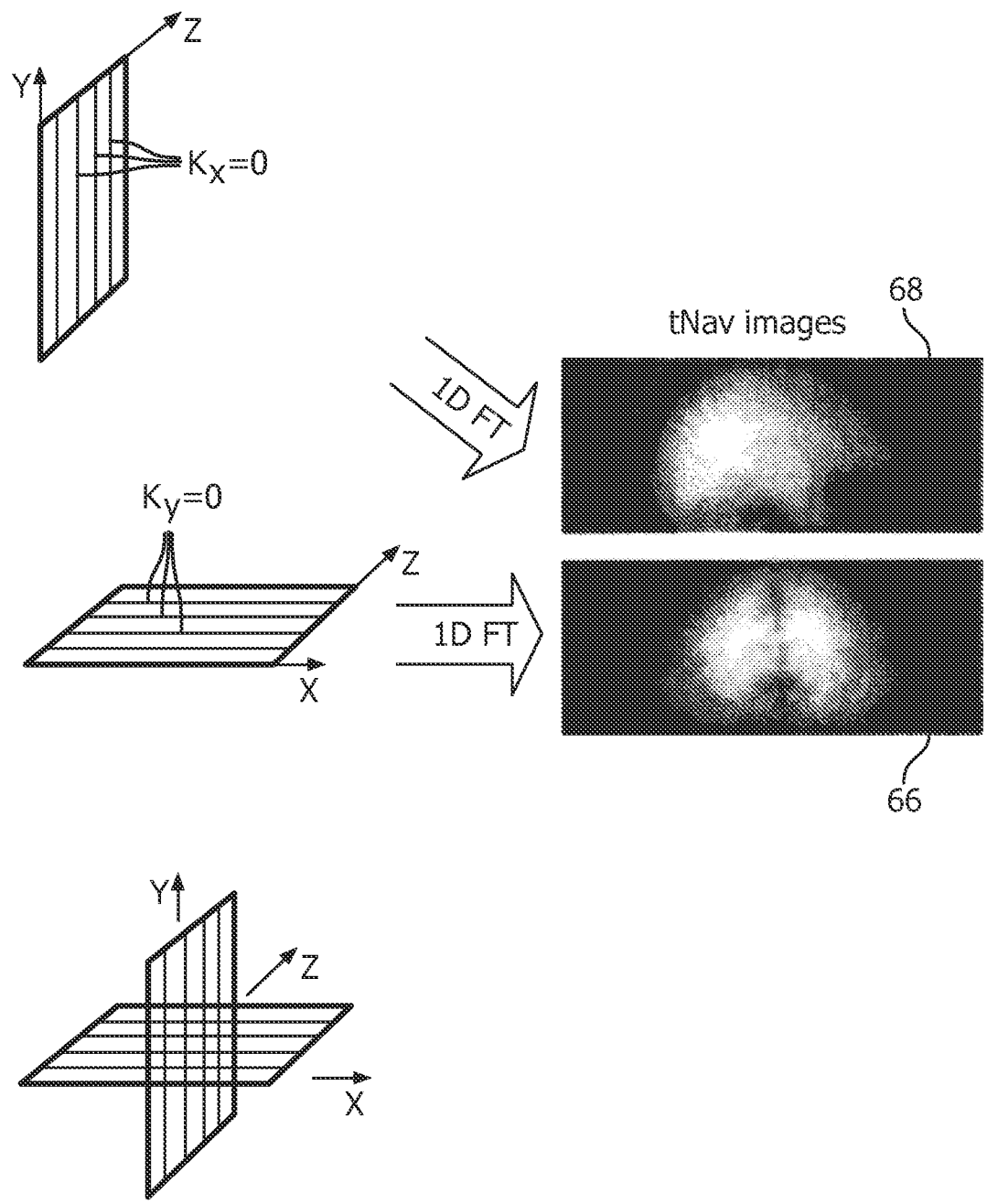
FIG. 4 illustrates example reconstructed navigation images.

FIG. 4 shows an example first and second navigation projection images 66, 68 reconstructed after each shot or TR. The images are acquired in k-space orthogonal to the image slice. The inverse 1D Fourier Transform (1D FT) is used to reconstruct the $k_y=0$ k-space data lines and the $k_x=0$ k-space data lines into the first and second navigation projection images 66, 68. The example shows a brain scan. The top tNav or second navigation projection image 68 shows a sagital image of the brain while the lower tNav or first navigation projection image 66 shows a coronal image. Both images are orthogonal to, in this instance, the transverse or axial image slices 58.

Figure 5:
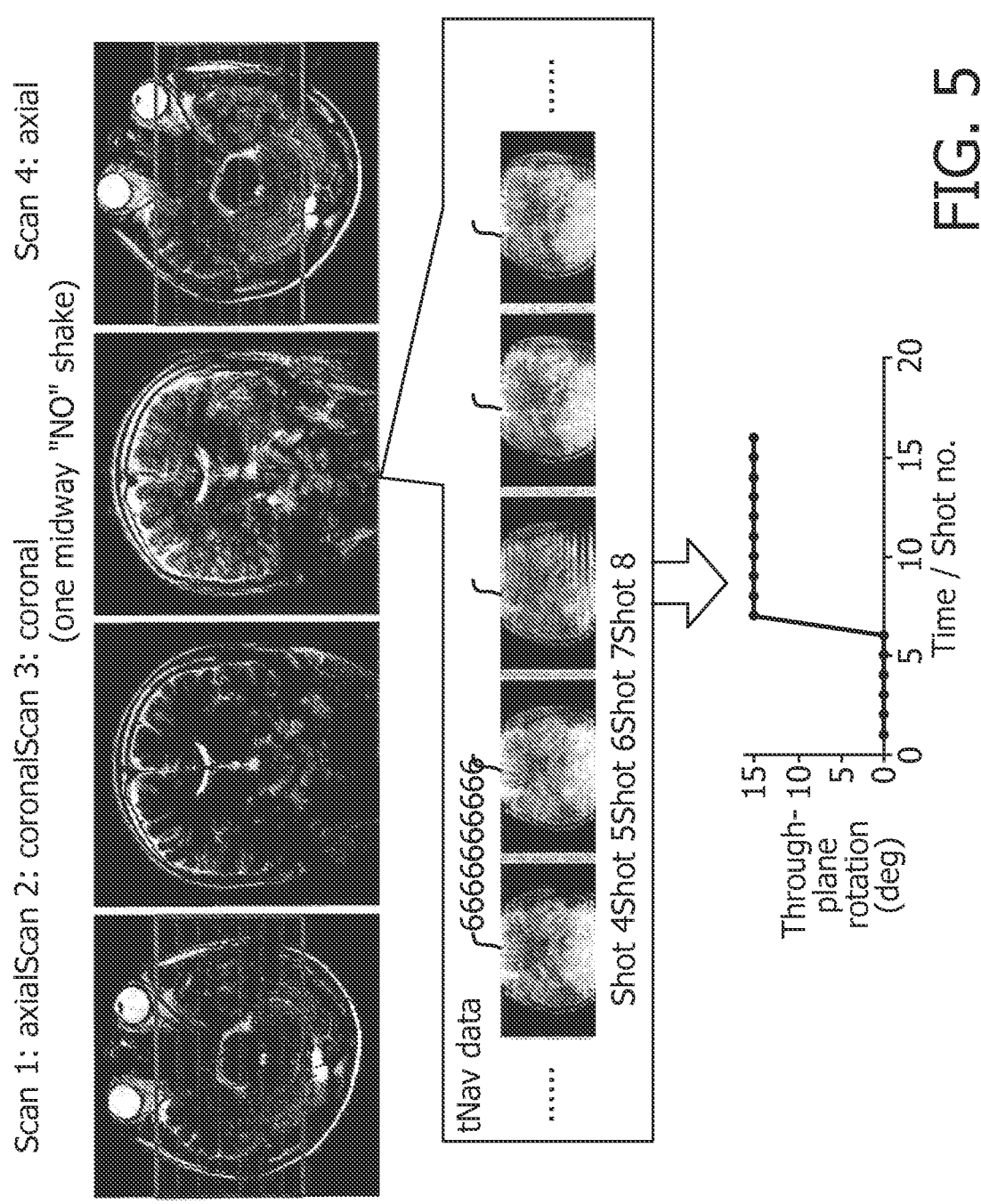
FIG. 5 illustrates example motion detection using navigation planes.

FIG. 5 illustrates an example motion detection using the navigation images. Four references scans are shown. The first two scans are an axial and a coronal scan. Midway through scan 3, the subject gives a "no" shake of the head which involves rotational motion. Scan 4, compared with scan 1, illustrates the difference in movement. One of the pair of tNav or first navigation projection image 66 are displayed below the reference images. By comparing the navigation images from successive TRs or shots, it will be seen that motion occurred between shots 6 and 7. The rotational plane using the first navigation projection image 66 is measured at 15 degrees.

The illustratively low resolution first and second navigation projection images 66, 68 are compared using regional image correlation to determine translation and rotation. The regional image correlation algorithm is computationally efficient and produces a fast result. The imaging data acquisition is then adjusted real-time by k-space translation/rotation. Data in the next repeat time 56 (TR) is acquired using the adjusted k-space for continuous acquisition.

Figure 6:
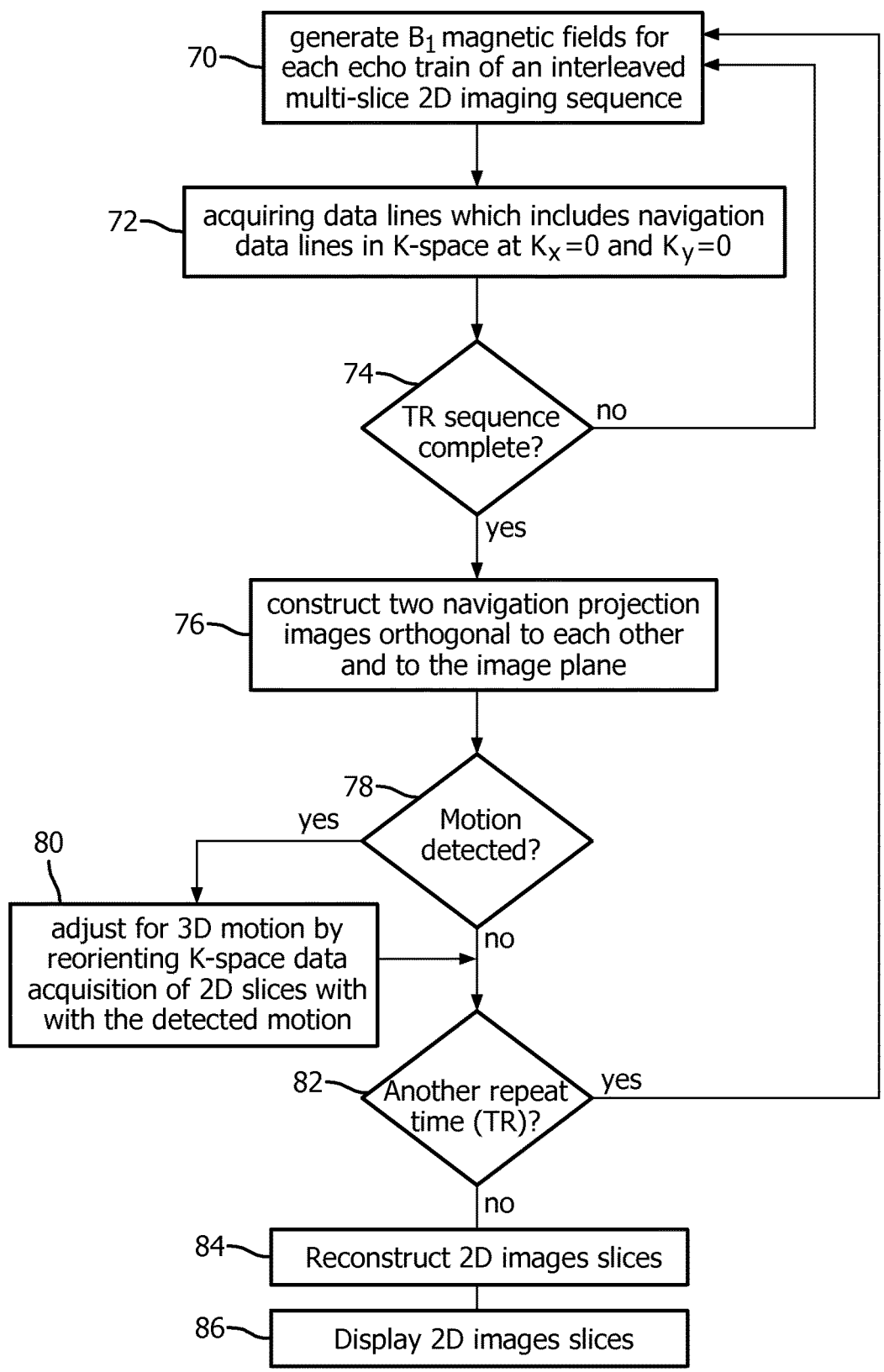
FIG. 6 flowcharts one embodiment of the imaging method.

With reference to FIG. 6, one embodiment of the method of MR imaging is flowcharted. In a step 70, the excitation pulse 60 is generated to induce resonance in one of the slices. In a step 72, a series of resonance signals are acquired which are demodulated to generate the pair of navigation data lines and the series of k-space data lines in the one slice. In an alternative embodiment, the data acquisition embeds the navigation imaging though orthogonal fields such as in a radial acquisition. The excitation and acquisition are repeated for each slice until data has been acquired from all of the slices. At the conclusion of the repeat time (TR), the pair of low resolution navigation images are reconstructed from the navigation k-space data lines in a step 76.

In a decision step 78, successive navigation images are compared to detect motion. Motion is identified using anatomical structures and various standard techniques in imaging. For example, the same characteristic features are identified in the images and any change in location in subsequent navigation images is indicative of translation, rotation, etc. If motion is detected, then in a step 80, k-space is reoriented for subsequent data acquisition using the measured motion. Alternatively, the imaging coordinate system of the gradient pulses is reoriented to keep the imaging system constant relative to the coordinate system of the imaged region. The process continues with the reoriented k-space or coordinate system. In a step 82, the system determines if there is another TR. If needed, then the system starts another sequence beginning with generating the $B_1$ fields. If no further TRs are needed to complete the diagnostic image data acquisition, then imaging k-space data lines are reconstructed in a step 84. The data can be reconstructed using a 3D reconstruction or a series of 2D reconstructions. The reconstructed image slices or ther images are displayed and/or stored for later review in a step 86. The reconstructed images can be stored in a storage management system such as a Picture Archiving and Communications System (PACS), a Radiology Information System (RIS), and the like. The reconstructed image slices can be displayed on a display device such as a monitor, computer screen, and the like.

It is to be appreciated that in connection with the particular exemplary embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance scanner, comprising:
   main magnet coils, which generate a $B_0$ field;
   gradient windings and a gradient coil controller, which generates gradients across the $B_0$ field;
   one or more RF coils, or one of more local RF coils, which transmit $B_1$ pulses and receive magnetic resonance signals;
   an RF transmitter, which transmits $B_1$ pulses to the RF coils to excite and manipulate resonance;
   an RF receiver, which demodulates received resonance signals into imaging data lines;
   a sequence controller connected to the gradient controller, and the RF transmitter, the sequence controller being configured to:
      control the RF transmitter and the gradient coil controller to implement an interleaved multi-slice 2D imaging sequence, which in each of a plurality of repetitions (TRs) generates a first and second navigation data lines and at least one image data line for each of a plurality of slices; and one or more processors configured to:
reconstruct the first navigation data lines from the plurality of slices into a first navigation projection image;
reconstruct the second navigation data lines from the plurality of slices into a second navigation projection image; and
compare successive navigation projection images to detect and adjust for 3D motion; and a display device, which displays reconstructed 2D slices.

2. The magnetic resonance scanner according to claim 1, wherein the first and second navigation projection images are orthogonal to each other.

3. The magnetic resonance scanner according to claim 1, wherein the first and second navigation data lines are read out in orthogonal directions.

4. The magnetic resonance scanner according to claim 1, wherein the first and second navigation data lines, and the imaging data lines are acquired radially.

5. The magnetic resonance scanner according to claim 1, wherein the one or more processors are further programmed to:
control the gradient controller and/or the RF transmitter to move an imaging coordinate system in accordance with the detected motion.

6. The magnetic resonance scanner according to claim 1, wherein the first and second navigation data lines acquired include zero phase encoding.

7. The magnetic resonance scanner according to claim 1, wherein the one or more processors are further programmed to:
adjust the imaging data lines for each slice to compensate for detection motion; and
reconstruct the adjusted data lines for each slice into a corresponding motion corrected slice image.

8. The magnetic resonance scanner according to claim 1, wherein the one or more processors are further configured to:
reorient k-space for subsequent data acquisition using the detected motion, or
reorient the imaging coordinate system of gradient pulses to maintain an imaging system of the magnetic resonance scanner substantially constant relative to a coordinate system of an imaged region.

9. A method of magnetic resonance imaging, the method comprising:
implementing an interleaved multi-slice 2D imaging sequence in which each of a plurality of repetitions (TRs) generates a first navigation data line, a second navigation data line, and at least one imaging data line for each of a plurality of slices;
after each of the plurality of repetitions (TRs) reconstructing the first data lines from the plurality of slices into a first navigation projection image;
after each of the plurality of repetitions (TRs) reconstructing the first data lines from the plurality of slices into a second navigation projection image;
comparing successive navigation projection images to detect 3D motion, and based on the comparing, adjusting for 3D motion; and
displaying reconstructed 2D slices on a display device.

10. The method of magnetic resonance imaging according to claim 9, wherein the first and second navigation projection images are orthogonal to each other.

11. The method of magnetic resonance imaging according to claim 10, wherein the first and second navigation data lines are read out in orthogonal directions.

12. The method of magnetic resonance imaging according to claim 9, wherein the first and second navigation data lines, and the imaging data lines are acquired radially.

13. The method of magnetic resonance imaging according to claim 9, further including:
adjusting the imaging data lines for each slice to compensate for detection motion; and
reconstructing the adjusted imaging data lines for each slice into a corresponding motion corrected slice image.

14. The method of magnetic resonance imaging according to claim 9, further including:
controlling a gradient controller and/or an RF transmitter to move an imaging coordinate system in accordance with the detected motion.

15. The method of magnetic resonance imaging according to claim 14, wherein the adjusting further comprises:
reorienting k-space for subsequent data acquisition using the detected motion, or reorienting the imaging coordinate system to maintain an imaging system of a magnetic resonance scanner substantially constant relative to a coordinate system of an imaged region.

16. The method of magnetic resonance imaging according to claim 9, wherein the first and second navigation data lines acquired include zero phase encoding.

17. A non-transitory computer-readable medium carrying software for controlling one or more processors to perform the method according to claim 9.

18. An MR system comprising:
one or more processors programmed to perform the method according to claim 9; and
a scanning system controlled by the one or more processors to implement an interleaved multi-slice 2D imaging system.

19. A magnetic resonance scanner, comprising:
one or more processors programmed to:
acquire data from each echo train in an interleaved 2D multi-slice imaging sequence in each of a plurality of repetitions (TRs), the imaging sequence generates navigation data lines orthogonal to each other and imaging data lines that are parallel to each other in each of a plurality of slices;
reconstruct the navigation data lines from each of the plurality of slices into orthogonal navigation projection images after each of the plurality of repetitions (TR);
compare successive reconstructed navigation images from each repeat time to detect motion;
compare successive navigation images to detect motion; and
reorient k-space for subsequent data acquisition using the detected motion, or reorient an imaging coordinate system of gradient pulses to maintain an imaging system of the magnetic resonance scanner substantially constant relative to a coordinate system of an imaged region.

20. The magnetic resonance scanner according to claim 19, wherein the one or more processors are further programmed to:
reconstruct the imaging data lines into a diagnostic image.

21. The magnetic resonance scanner according to claim 19, wherein the navigation data lines, and the imaging data lines are acquired radially.

22. The magnetic resonance scanner according to claim 19, wherein the one or more processors are further programmed to:
   control a gradient controller and/or an RF transmitter to move an imaging coordinate system in accordance with the detected motion.

23. The magnetic resonance scanner according to claim 19, wherein the navigation data lines acquired include zero phase encoding.

24. The magnetic resonance scanner according to claim 19, wherein the one or more processors are further programmed to:
   adjust the imaging data lines for each of the plurality of slices to compensate for detection motion; and
   reconstruct the adjusted data lines for each slice into a corresponding motion corrected slice image.

* * * * *